United States Patent
Coimbra et al.

(10) Patent No.: US 11,867,571 B2
(45) Date of Patent: Jan. 9, 2024

(54) SELF-TURN-ON TEMPERATURE DETECTOR CIRCUIT

(71) Applicant: NXP B.V., Eindhoven (NL)

(72) Inventors: Ricardo Pureza Coimbra, Campinas (BR); Mateus Ribeiro Vanzella, Campinas (BR)

(73) Assignee: NXP B.V., Eindhoven (NL)

( * ) Notice: Subject to any disclaimer, the term of this patent is extended or adjusted under 35 U.S.C. 154(b) by 224 days.

(21) Appl. No.: 17/491,744

(22) Filed: Oct. 1, 2021

(65) Prior Publication Data

US 2023/0108765 A1 Apr. 6, 2023

(51) Int. Cl.
*G01K 7/01* (2006.01)
*G01K 15/00* (2006.01)
*H03K 17/687* (2006.01)

(52) U.S. Cl.
CPC .......... *G01K 7/015* (2013.01); *G01K 15/005* (2013.01); *H03K 17/6872* (2013.01); *G01K 7/01* (2013.01)

(58) Field of Classification Search
CPC ... G01K 7/015; G01K 15/005; H03K 17/6872
USPC ....................................................... 702/130
See application file for complete search history.

(56) References Cited

U.S. PATENT DOCUMENTS

| | | | | |
|---|---|---|---|---|
| 5,084,665 A | * | 1/1992 | Dixon | G05F 3/267 323/907 |
| 5,155,384 A | * | 10/1992 | Ruetz | H03K 17/223 327/143 |
| 6,016,050 A | * | 1/2000 | Brokaw | G05F 3/205 327/563 |
| 7,579,898 B2 | | 8/2009 | Soldera et al. | |
| 10,712,875 B2 | * | 7/2020 | Malevsky | G05F 3/30 |
| 2003/0227756 A1 | * | 12/2003 | Abe | H03F 3/343 361/748 |

(Continued)

FOREIGN PATENT DOCUMENTS

CN 103713684 B * 1/2016
CN 109426295 A * 3/2019

(Continued)

OTHER PUBLICATIONS

Luis Cartagena et al., Low Power CMOS Temperature Protection Sensor for Smart Cards, 2017 SBMO/IEEE MTT-S International Microwave and Optoelectronics Conference (IMOC), Aug. 27-30, 2017.

*Primary Examiner* — Gail Kaplan Verbitsky

(57) ABSTRACT

A low power temperature detection method, system, and apparatus sense when a temperature threshold is reached by connecting a current conveyor (111) with a startup bias circuit (112) having a first FET (P1) (connected to level shift a reference voltage to provide an input voltage $V_{S1}$), a first diode-connected BJT (Q0) (connected to generate a base-emitter voltage based on the junction temperature), and a second FET (P2) (connected to level shift the base-emitter voltage), where the startup bias circuit (112) selectively connects the current conveyor (111) to ground to form a closed loop that is activated only when an emitter current at the first diode-connected BJT (Q0) enters a self-turned-on operation region, thereby activating the current conveyor to detect a temperature threshold being reached by the device junction temperature.

20 Claims, 5 Drawing Sheets

(56) References Cited

U.S. PATENT DOCUMENTS

| | | | |
|---|---|---|---|
| 2006/0038550 A1* | 2/2006 | Nazarian | G05F 3/205 |
| | | | 323/315 |
| 2007/0080743 A1* | 4/2007 | Hsiao | G05F 1/468 |
| | | | 327/543 |
| 2008/0036525 A1* | 2/2008 | Kim | G01K 7/425 |
| | | | 327/512 |
| 2008/0279027 A1 | 11/2008 | Boeve | |
| 2009/0067471 A1 | 3/2009 | Goto et al. | |
| 2009/0315532 A1 | 12/2009 | Negoi et al. | |
| 2011/0001546 A1* | 1/2011 | Guo | G01K 3/005 |
| | | | 327/512 |
| 2012/0327972 A1* | 12/2012 | Seon | G01K 7/01 |
| | | | 374/178 |
| 2020/0159271 A1* | 5/2020 | Wu | G11C 16/14 |
| 2022/0413539 A1* | 12/2022 | Nyshadham | G05F 1/468 |
| 2023/0090295 A1* | 3/2023 | Pothireddy | G05F 3/262 |
| | | | 327/539 |
| 2023/0142312 A1* | 5/2023 | Chen | G05F 3/30 |
| | | | 323/313 |

FOREIGN PATENT DOCUMENTS

| | | | | | |
|---|---|---|---|---|---|
| CN | 217404784 | U | * | 9/2022 | |
| GB | 2186756 | A | * | 8/1987 | G05F 3/30 |
| GB | 2442494 | A | * | 4/2008 | G05F 3/30 |
| JP | 4230205 | B2 | * | 2/2009 | |

* cited by examiner

SELF-TURN-ON TEMPERATURE DETECTOR CIRCUIT

BACKGROUND OF THE INVENTION

Field of the Invention

The present invention is directed in general to field of electronic circuits. In one aspect, the present invention relates generally to temperature detection circuits and associated methods of operation.

Description of the Related Art

Temperature detector circuits are extensively used in integrated circuit devices use reduce device damage or performance problems due to overheating by monitoring the internal chip temperature to signal temperatures that exceed a temperature threshold. However, conventional temperature sensors can require an undesirable amount of power to operate, particularly for integrated circuit systems that include low-power modes or applications where most of the system goes into a low-power stand-by state (e.g., with most of its domains being power-gated) during long periods of time to save power. In such systems, temperature detectors must generally operate continuously for safety and/or security purposes. For example, there are existing CMOS temperature protection sensors which use a comparator circuit to compare a base-emitter voltage $V_{EB}$ produced by a PNP transistor with voltage reference signal, but such comparator circuits inherently consume current across all temperature ranges. In addition, existing temperature sensors typically require continuous generation of the base-emitter voltage $V_{EB}$ and voltage reference signal, but by employing special low-power structures to generate the reference voltage during low power modes, the resulting accuracy of the generated reference voltage is reduced as compared to using a more sophisticated bandgap reference circuit to generate the reference voltage. There are other temperature detector circuits which employ amplifiers and comparators having unbalanced input MOS transistors such that their input offsets become temperature-dependent, but such unbalanced input MOS transistors are difficult to design and fabricate since they require different channel doping concentrations and, in the comparator's case, different drain current densities. In addition, MOS transistor thermal parameters show significantly higher non-linear components and spread than their bipolar transistor counterparts, resulting in reduced accuracy in temperature detection which can impair circuit calibration at test temperatures different than the threshold temperature of interest. Thus, it can be seen from the foregoing that existing temperature detection solutions are extremely difficult at a practical level by virtue of the difficulty in balancing the tradeoff between temperature detection performance against circuit complexity, size, and power consumption required to support the temperature detector circuits.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
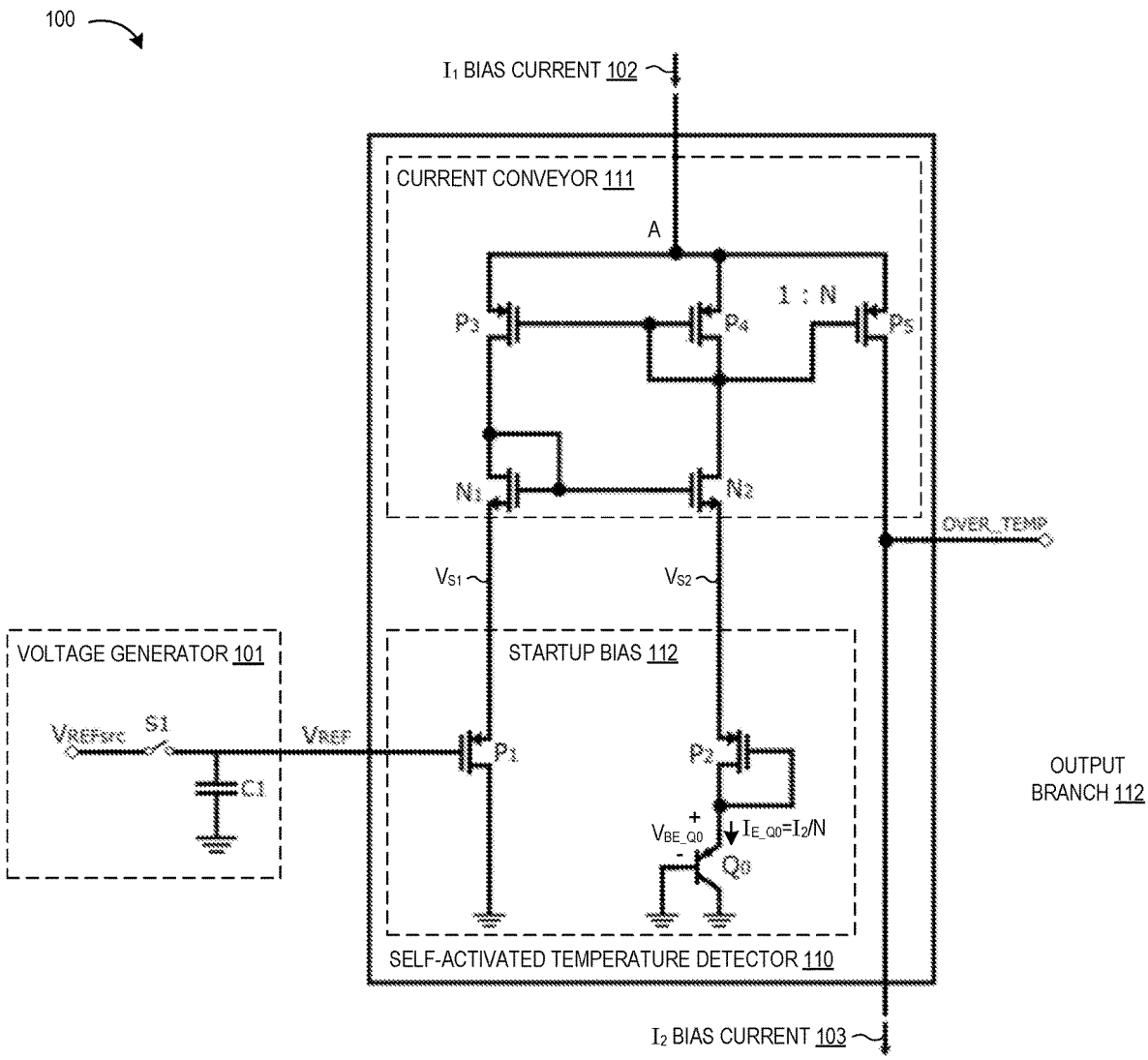
FIG. 1 shows a simplified circuit schematic diagram of a self-activated temperature detector circuit to monitor a single temperature threshold in accordance with selected embodiments of the present disclosure.

A system, apparatus, and methodology are described for providing a self-activated temperature detector circuit to detect when junction temperature rises above one or more high temperature thresholds by using a compact current mirror circuit arrangement to compare an input reference voltage with a base-emitter voltage produced by a bipolar junction transistor that biased with a current magnitude that is proportional to an input bias current for the current mirror circuit which is connected to form a self-biased closed-loop structure to provide continuous temperature monitoring with ultra-low-power operation. In selected embodiments, the temperature detector circuit includes a first generation current conveyor circuit connected to ground over a start-up bias circuit which includes a $V_{REF}$-gated transistor connected between ground and a first branch of the current conveyor circuit, and also includes a diode-connected bipolar junction transistor (BJT) and diode-connected transistor connected between ground and a second branch of the current conveyor circuit. In this configuration, the diode-connected BJT acts as a gatekeeper to effectively disconnect the current conveyor circuit from ground, thereby deactivating the loop behavior of the current conveyor circuit when the junction temperature Tj is safely below the threshold temperature $T_{TSH}$. However, as the junction temperature Tj approaches the threshold temperature $T_{TSH}$, the diode-connected BJT effectively connects the current conveyor circuit to ground, thereby activating the loop behavior of the current conveyor circuit. In this way, a self-biased closed-loop structure is employed which remains intrinsically inactive (turned off) at low and mid-range temperatures, but at a high temperature range, the self-biased closed-loop structure automatically generates its biasing currents (of low magnitude) to become fully functional to accurately detect when junction temperature crosses the threshold(s) monitored. Temperature hysteresis may be easily added. The detection result(s) is provided through digital output(s). With the disclosed start-up bias circuit addition, the self-activated temperature detector circuit provides continuous temperature monitoring with good accuracy, very small area requirements, and very small power consumption that is virtually zero at low and mid-range temperatures. Compared with existing temperature sensors, the disclosed self-activated temperature detector circuit provides significantly improved power-performance-area trade-offs that are well suited for current technology trends toward ultra-low-power operation, such as battery-supplied IoT applications.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. Such descriptions and representations are used by those skilled in the art to describe and convey the substance of their work to others skilled in the art. Although the described exemplary embodiments disclosed herein are directed to an exemplary self-activated temperature sensor circuits, the present invention is not necessarily limited to the example embodiments illustrate herein, and various embodiments of the circuitry and methods disclosed herein may be implemented with other devices and software components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

For an improved understanding of selected embodiments of the present disclosure, reference is now made to the FIG. 1 which shows a simplified circuit schematic diagram 100 of a self-activated temperature detector 110 which is connected to a reference voltage generator 101 for monitoring a single temperature threshold to detect when a junction temperature rises above a high temperature threshold. As depicted, the temperature detector 110 includes a current conveyor circuit 111 and startup bias circuit 112 that are connected to compare an input reference voltage $V_{REF}$ generated by the voltage generator 101 with a base-emitter voltage $V_{BE}$ produced by a diode-connected PNP transistor Q0 that is biased with an emitter current $I_E$ having a magnitude that is proportional to an input bias current $I_2$. In selected embodiments, the current conveyor circuit 111 and startup bias circuit 112 are configured as a self-biased closed-loop structure which remains intrinsically inactive (turned off) at low and mid-range temperatures, and which becomes fully functional at high temperature ranges when the temperature detector 110 automatically generates its biasing currents (of low magnitude) to enable accurate detection when junction temperature crosses the monitored temperature threshold.

As depicted, the voltage generator 101 is connected to generate an output reference voltage $V_{REF}$ by using an input switch S1 to selectively sample and hold the input voltage $V_{REFsrc}$ at an input capacitor C1. As will be appreciated, the depicted voltage generator 101 represents a suitable approach for generating accurate reference voltages at low power cost in low-power applications, but other voltage generation circuits can be used. In addition or in the alternative, the $V_{REFsrc}$ generation circuitry (not shown) may be periodically turned-on to only replenish the capacitor charge lost by leakage. However generated, the reference voltage $V_{REF}$ is provided as an input to the startup bias circuit 112 of the self-activated temperature detector 110. In addition, the self-activated temperature detector 110 is connected to receive a first biasing current $I_1$ flowing into a finite impedance input node A of the current conveyor 111. Though not shown, it will be appreciated that the input node A may be connected to a positive power supply terminal which may be at a constant reference level, such as $V_{DD}$. The depicted self-activated temperature detector 110 is also connected to a second biasing current $I_2$ flowing at the output node OVER_TEMP. As disclosed, the biasing current signals $I_1$, $I_2$ may be generated with any suitable current sources, such as are commonly embedded in a system-on-chip (SoC) to provide low-magnitude biasing currents (e.g., units to tens of nano-amperes). In addition, the current conveyor 111 is connected to receive first and second input voltages $V_{S1}$, $V_{S2}$ which are provided by the startup bias circuit 112.

The depicted current conveyor 111 includes depletion-type n-channel MOS (NMOS) transistors N1, N2 and PMOS transistors P3, P4, P5, each having MOSFET gate, source, and drain terminals and connected to form a first branch N1, P3, a second branch N2, P4, and an output branch P5. In particular, the drain and gate of the NMOS transistor N1 is connected to the drain of the PMOS transistor P3 to form the first branch between the input node A and the source of the transistor N1 which is connected to the startup bias circuit 112. In addition, the drain of the NMOS transistor N2 is connected to the gate and drain of the PMOS transistor P4 to form the second branch between the input node A and the source of the transistor N2 which is connected to the startup bias circuit 112. Finally, the gate of the PMOS transistor P5 is connected to the gate and drain of the PMOS transistor P4 to form the third branch between the input node A and the output node OVER_TEMP. As a result, the sources of the transistors N1 and N2 are connected over the startup bias circuit 112 to ground, and the PMOS transistors P3, P4 have their sources connected in common to the input node A to receive the first input bias current $I_1$ 102, while the gates of the PMOS transistors P3, P4, P5 are connected in common to the drain of the PMOS transistor P4 to form a current mirror which exhibits loop behavior, where the output branch PMOS transistor P5 provides the output current of the current conveyor 111 which is a copy of the first or second branch currents.

The depicted startup bias circuit 112 includes a first PMOS transistor P1 which is connected between the first branch of the current conveyor 111 and ground, and which inputs a reference voltage $V_{REF}$ at the gate of PMOS transistor P1 as a high impedance port to provide a level shift from the reference voltage $V_{REF}$ to a first input voltage $V_{S1}$.

In particular, the PMOS transistor P1 has a gate connected to receive the reference voltage $V_{REF}$, a source connected to provide the first input voltage $V_{S1}$ to the first branch of the current conveyor 111, and a drain connected to ground. In addition, the startup bias circuit 112 includes a second PMOS transistor P2 and diode-connected PNP transistor Q0 which are series connected between the second branch of the current conveyor 111 and ground. In particular, the PMOS transistor P2 has a source connected to provide the second input voltage $V_{S2}$ to the second branch of the current conveyor 111, and a drain and gate connected to an emitter of PNP transistor Q0 which has its base and collector connected to ground. In this way, the PMOS transistor P2 inputs the base-emitter voltage $V_{EB\_Q0}$ at the gate of PMOS transistor P2 as a high impedance port to provide a level shift from the base-emitter voltage $V_{EB\_Q0}$ to a second input voltage $V_{S2}$. In selected embodiments, the BJT Q0 may be a small sized transistor, such as by using a single "standard" PNP of the technology. By design, the magnitude of the reference voltage $V_{REF}$ and the size of the BJT Q0 are chosen such that the BJT Q0 is biased with emitter current $I_E=I_2/N$ to produce a base-emitter voltage $V_{EB\_Q0}(I_2/N)=V_{REF}$ at the desired threshold temperature ($T_{TSH}$).

By design of the current conveyor 111, the NMOS transistors N1, N2 may be sized to match one another, and the PMOS transistors P3, P4 may be sized to match one another. In addition, the PMOS transistors P1, P2 in the startup bias circuit 112 may be sized to match one another. Finally, the PMOS transistor P5 is sized to be a multiple N of the size of the PMOS transistors P3, P4, where N is may be an integer that is equal to or greater than 1. When identical sizes are used for each pair of devices N1/N2, P1/P2, and P3/P4, the correspondingly paired gate-source voltages are equalized (e.g., $V_{GS\_N1}=V_{GS\_N2}$, $V_{SG\_P1}=V_{SG\_P2}$, and $V_{SG\_P3}=V_{SG\_P4}$) when the base-emitter voltage $V_{EB\_Q0}$ applied to the gate of the PMOS transistor P2 is equal to the reference voltage $V_{REF}$ applied to the gate of the PMOS transistor P1 (e.g., $V_{EB\_Q0}=V_{REF}$).

To illustrate the operation of the current conveyor 111 and startup bias circuit 112, if the current conveyor input voltages are equal (e.g., $V_{S1}=V_{S2}$), everything in the current conveyor 111 is matched and currents through the first branch N1/P3 and second branch N2/P4 have no reason to change. However, if the $V_{S1}>V_{S2}$, the current through the first and second branches P3/N1, N2/P4 start to increase and tend to continue increasing indefinitely. Alternatively, if the $V_{S1}<V_{S2}$, the current through the first and second branches P3/N1, N2/P4 start to decrease and tend to continue decreasing until reaching zero. This behavior of the current conveyor 111 results from the loop formed by the first and second branches P3/N1, N2/P4. In particular, any current increase/decrease at the NMOS transistor N2 is copied by the PMOS transistors P3, P4 to the NMOS transistor N1, causing the gate voltage of the NMOS transistors N1, N2 to change in the direction that reinforces the current increase/decrease at the NMOS transistor N2. The current conveyor 111 only reaches a stable condition because of the negative feedback created by the startup bias circuit 112 connected to the current conveyor input voltages $V_{S1}$, $V_{S2}$. In particular, the force of feedback provided by the startup bias circuit 112 changes the branch currents towards a value that equalizes the input voltage $V_{S1}$ (produced by the PMOS transistor P1 having a gate connected to $V_{REF}$) and the input voltage $V_{S2}$ (produced by the BJT Q0 in series with the PMOS transistor P2), therefore stabilizing with $V_{S1}=V_{S2}$.

While the source of the PMOS transistor P5 is shown as being connected in common to the input node A, it will be appreciated that the source of the PMOS transistor P5 may instead be connected directly to $V_{DD}$ to enable the output node OVER_TEMP to continue reaching a voltage close to $V_{DD}$ after the current through the PMOS transistors P3 and P4 is limited by the biasing current signal $I_1$. However, the circuit design can support the output node OVER_TEMP not rising as high as $V_{DD}$ by designing the following circuit that receives the output node OVER_TEMP (e.g., a Schmitt-trigger) with thresholds that are adjusted accordingly. For purposes of the present disclosure, it is noted that, before limiting the current through the PMOS transistors P3, P4, the biasing current signal $I_1$ acts as a "closed switch" which shorts the sources of the PMOS transistors P3, P4 to $V_{DD}$ such that the PMOS transistors P3-P5 act as a current mirror.

As described herein and illustrated in FIG. 1, the current conveyor 111 and startup bias circuit 112 form a closed-loop structure composed of the sequentially connected circuit elements P1, N1, P3, P4, N2, P2, and Q0 which dynamically adjusts its branch currents (and hence Q0 emitter current $I_E$) to make $V_{EB\_Q0}=V_{REF}$. By design, the magnitude of the emitter current $I_E$ is made equal to $I_2/N$ when the junction temperature $T_J$ is equal to threshold temperature $T_{TSH}$. Due to the negative thermal coefficient of base-emitter voltage $V_{EB\_Q0}$, the behavior of the closed-loop structure will set $I_E<I_2/N$ when the junction temperature $T_J$ is below the threshold temperature $T_{TSH}$ (e.g., $T_J<T_{TSH}$), and will set $I_E>I_2/N$ when the junction temperature $T_J$ is above the temperature threshold (e.g., $T_J>T_{TSH}$). At the output branch, the PMOS transistor P5 generates an amplified copy of the emitter current ($N \cdot I_E$) which is compared to the input biasing current $I_2$ to generate a digital output flag signal OVER_TEMP that indicates if the junction temperature $T_J$ is above or below the monitored threshold temperature $T_{TSH}$. If the input biasing current $I_2$ is larger than the amplified copy of the emitter current ($N \cdot I_E$), then the voltage at the digital output OVER_TEMP is pulled down to 0V, indicating that the junction temperature $T_J$ is below the monitored threshold temperature $T_{TSH}$. However, if the input biasing current $I_2$ is less than the amplified copy of the emitter current ($N \cdot I_E$), then the voltage at the digital output OVER_TEMP is pulled up to the clamped voltage, indicating that the junction temperature $T_J$ is at or above the monitored threshold temperature $T_{TSH}$.

Due to the high-order dependence of the emitter current $I_E$ with temperature, the magnitude of the emitter current $I_E$ will change significantly as $T_J$ departs from $T_{TSH}$. Towards higher temperatures, the emitter current $I_E$ will increase until the input biasing current signal $I_1$ limits the maximum current $I_{MAX}$ drawn by the circuit. In other words, the current consumption of the self-activated temperature detector 110 is limited to the input biasing current signal $I_1$ when $T_J>T_{TSH}$. Note that the digital output OVER_TEMP will continue to be maintained at logic HIGH state in this case. Towards lower temperatures, the emitter current $I_E$ will decrease to a negligible value (e.g., 10% or less of the full turn-on emitter current). In this case, the closed-loop structure effectively turns OFF as the branch currents are reduced until the self-activated temperature detector 110 becomes inactive with negligible current consumption (similar to a disabled state). As a result, the PMOS transistor P5 will not source appreciable current and input biasing current signal $I_2$ will maintain the digital output OVER_TEMP at logic state LOW.

Figure 2:
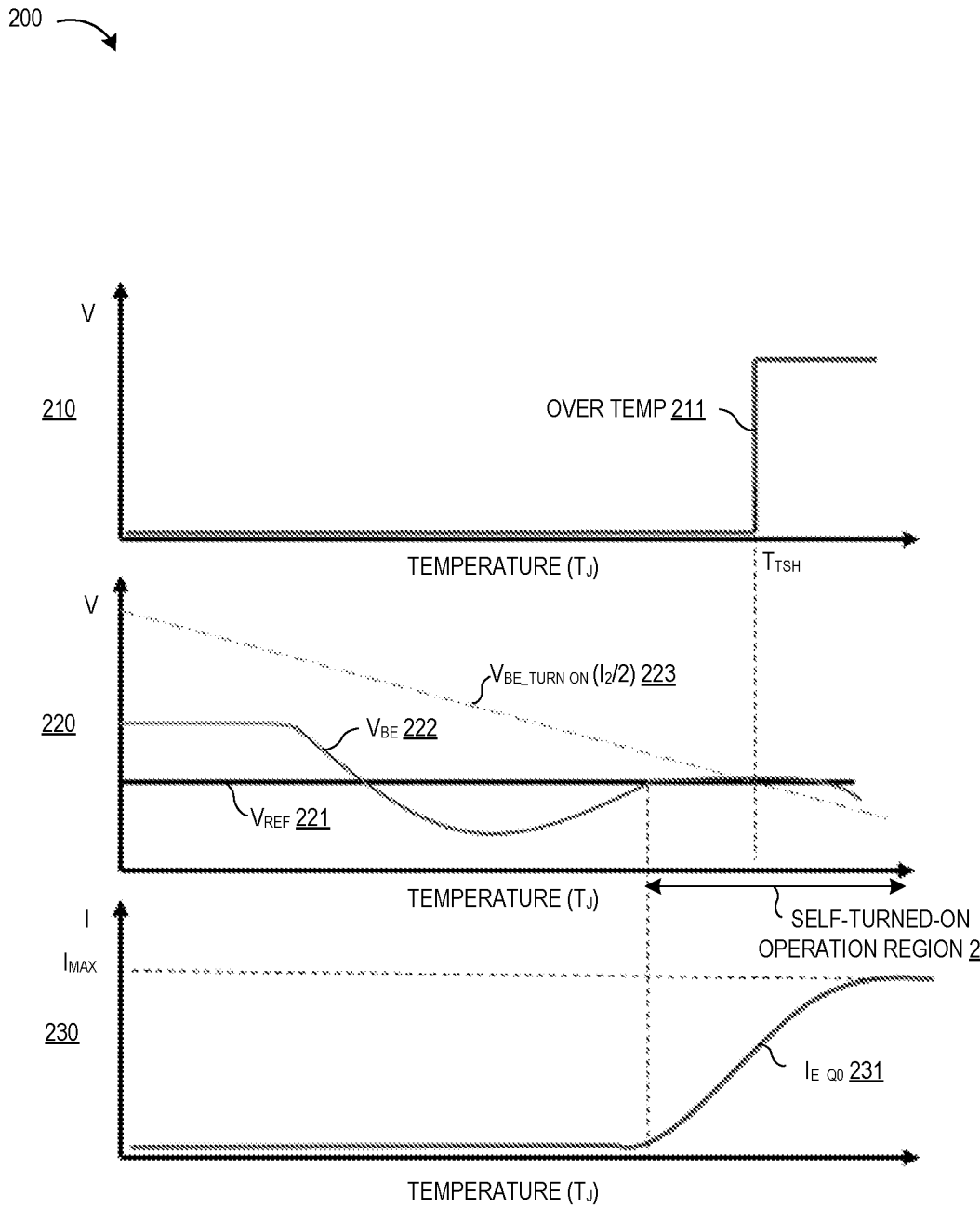
FIG. 2 shows timing diagrams for the signal waveforms of the self-activated temperature detector circuit shown in FIG. 1.

To illustrate the operation of the self-activated temperature detector circuit 110 shown in FIG. 1, reference is now made to FIG. 2 which shows timing diagrams 200 for the signal waveforms 210, 220, 230. In particular, the first voltage timing diagram 210 shows the digital output voltage OVER_TEMP 211 as a function of the junction temperature $T_J$, where the digital output voltage OVER_TEMP has a first or LOW value when the junction temperature $T_J$ is below the monitored threshold temperature $T_{TSH}$ and has a second or HIGH value when the junction temperature $T_J$ meets or exceeds the monitored threshold temperature $T_{TSH}$. At the second voltage timing diagram 220, the reference voltage $V_{REF}$ 221 and base-emitter voltage $V_{BE}$ 222 are plotted as a function of the junction temperature $T_1$, where the reference voltage $V_{REF}$ 221 is constant, and where the varying base-emitter voltage $V_{BE}$ 222 remains below the turn-on voltage $V_{BE\_TURN\_ON}$ 223 until the junction temperature $T_1$ reaches the monitored threshold temperature $T_{TSH}$. At the third current timing diagram 230, the emitter current $I_{E\_Q0}$ is plotted as a function of the junction temperature $T_J$, where the emitter current $I_{E\_Q0}$ 231 has a first, negligible leakage value until the junction temperature $T_J$ reaches a self-turned-on operation region 232 where the emitter current $I_{E\_Q0}$ 231 increases to provide sufficient current to activate the temperature detector to detect when the junction temperature $T_J$ meets or exceeds the monitored threshold temperature $T_{TSH}$.

As depicted in FIG. 2, when the junction temperature $T_J$ is well below the threshold temperature $T_{TSH}$, there is negligible current flowing in the circuit so that the BJT Q0 is turned OFF to place the emitter terminal in a high impedance state, i.e., having a potential defined by leakage only. In this region, the self-activated temperature detector circuit 110 generates the correct digital output which is essentially in an OFF state which allows the first and second input voltages $V_{S1}$, $V_{S2}$ to have unequal values since the current conveyor 111 is not functioning as a result of the FET devices N1-N2, P1-P5 not conducting any appreciable current.

By design, when the junction temperature $T_J$ approaches the threshold temperature $T_{TSH}$ by entering the self-turned-on operation region 232, the resulting leakage current $I_{E\_Q0}$ 231 is sufficient to guarantee "start-up" so that the devices P1-P5, N1-N2 become active (biased with enough current) so that the closed-loop structure is parametrically functional. Once the junction temperature enters that self-turned-on operation region 232, the current conveyor devices become biased with enough current for the "loop behavior" to begin driving together the current conveyor input voltages $V_{S1}=V_{S2}$. At this point, the self-activated temperature detector circuit 110 detects when the base-emitter voltage $V_{BE}$ 222 exceeds the turn-on voltage $V_{BE\_TURN\_ON}$ 223, at which point the BJT Q0 is fully turned ON to drive the emitter current $I_{E\_Q0}$ which, in turn, causes the PMOS transistor P5 to pull UP the OVER_TEMP 211.

As described herein, when the junction temperature $T_1$ reaches the threshold temperature (e.g., $T_J=T_{TSH}$), the reference voltage $V_{REF}$ is equal to the base-emitter voltage $V_{EB\_Q0}$ and the device transistors P1-P5, N1-N2 are designed to operate in an active region, $V_{SGP1}=V_{SGP2}$, $V_{GSN1}=V_{GSN2}$, and $V_{EB\_Q0}(I_2/N)=V_{REF}$. Employing the classical expression of the base-emitter voltage $V_{EB}(I,T)$, the equation $V_{REF}=V_{EB}$ may be expressed as follows:

$$V_{REF} = V_{EB}(I_C, T_{TSH}) = \\ V_{G0} - (V_{G0} - V_{EBN})\left(\frac{T_{TSH}}{T_N}\right) + \left(\frac{kT_{TSH}}{q}\right)\cdot\left(\ln\left(\frac{J_C}{CN}\right) - \eta\cdot\ln\left(\frac{T_{TSH}}{T_N}\right)\right) \quad \text{(Eq. 2)}$$

where the BJT collector current $$I_C = I_E \cdot \left(\frac{\beta}{\beta+1}\right),$$

with $\beta$ being defined as the ratio between the BJT collector $I_C$ and the BJT base current $I_B$. In addition, $V_{G0}$ is the bandgap voltage of the silicon extrapolated to 0K, $T_N$ is a specified reference temperature in Kelvin, $V_{EBN}$ is the $V_{EB}$ voltage at the reference temperature $T_N$, k is the Boltzmann's constant, q is the electron charge, $I_C$ is the collector current of the bipolar device, $I_{CN}$ is the collector current of the bipolar device at the reference temperature $T_N$ and $\eta$ is a process constant.

In practical applications, Equation 2 may generally be represented in the form of lookup tables or through non-linear fitting approximations (e.g., polynomial expressions) for optimal accuracy. Alternatively, the linear approximation shown below may be employed to compute the base-emitter voltage as a function of temperature $V_{EB}(T)$ when the $V_{EB}$ intrinsic curvature may be neglected.

$$V_{EB}(T) = V_{EBN} - T_{C1} \cdot (T - T_N) \quad \text{(Eq.3)}$$

$$\rightarrow T = \frac{V_{EBN} - V_{EB}(T)}{T_{C1}} + T_N. \quad \text{(Eq. 4)}$$

Figure 3:
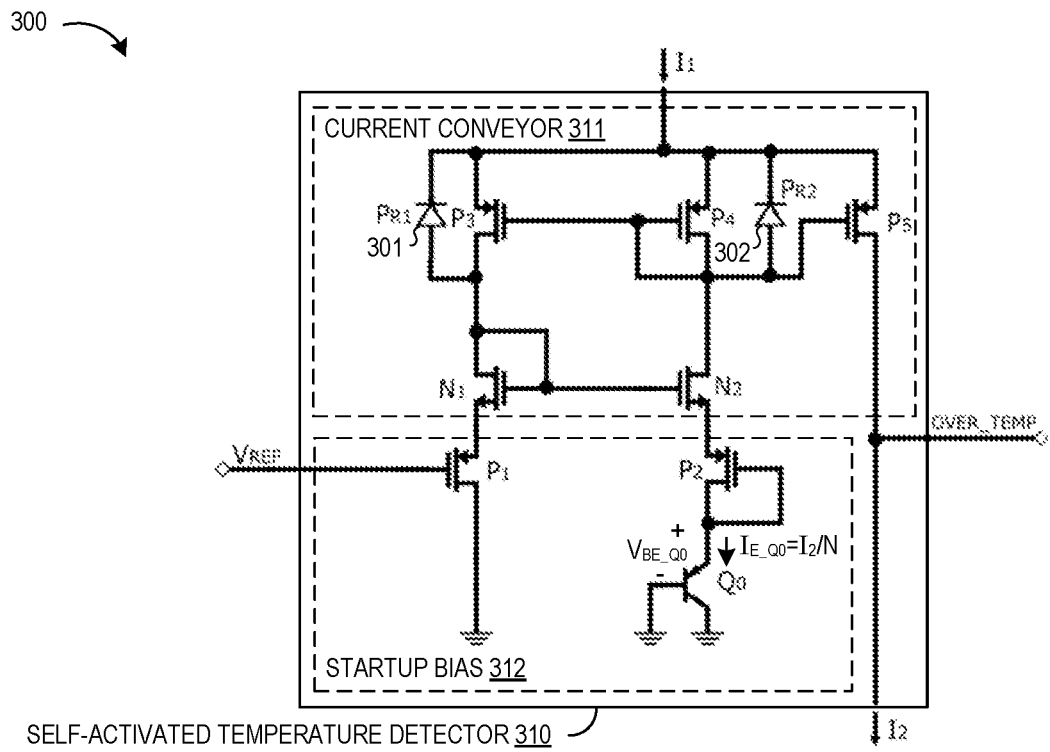
FIG. 3 shows a simplified circuit schematic diagram of a self-activated temperature detector circuit with one or more start-up resistor elements which guarantee start-up at high temperatures in accordance with selected embodiments of the present disclosure.

As will be appreciated, the self-activated temperature detector may include one or more design elements to ensure proper startup behavior. For example, reference is now made to FIG. 3 which shows a simplified circuit schematic diagram 300 of a self-activated temperature detector circuit 310 with one or more start-up resistor elements 301, 302 which guarantee start-up at high temperatures in accordance with selected embodiments of the present disclosure. As depicted, the temperature detector 310 includes a current conveyor circuit 311 and startup bias circuit 312 that are connected to compare an input reference voltage $V_{REF}$ with a base-emitter voltage $V_{BE\_Q0}$ produced by a diode-connected PNP transistor Q0 that is biased with an emitter current $I_E$ having a magnitude that is proportional to an input bias current $I_2$. In general terms, the current conveyor circuit 311 and startup bias circuit 312 are identical to the current conveyor circuit 111 and startup bias circuit 112 shown in FIG. 1. However, the current conveyor circuit 311 includes at least an additional pseudo-resistor PR1 301 which is connected across the source and drain terminals of the PMOS transistor P3 to guarantee start-up at high temperatures. In selected embodiments, the pseudo-resistor PR1 301 provides a reverse-biased diode function, and is designed such that its leakage current surpasses all other leakage sources connected to N1 drain terminal. In this way, the pseudo-resistor PR1 301 guarantees that the NMOS transistor N1 becomes biased, thereby guaranteeing that the whole loop is biased. In selected embodiments, and additional pseudo-resistor PR2 302 may be connected across the source and drain terminals of the PMOS transistor P4 for matching purposes, but may be omitted if the leakage current from the pseudo-resistor PR1 301 becomes negligible compared to the P3 drain current at $T_{TSH}$. In embodiments where the FET devices N1, N2, P3, P4 in the current conveyor 311 are chosen such that leakage current from the PMOS transistors P3 and P4 already dominates, the pseudo-resistors PR1 301, PR2 302 may be omitted. In other embodiments, the pseudo-resistors PR1 301 and PR2 302 may be implemented using diode-connected NMOS devices that are identical to or larger than the NMOS transistors N1 and N2 to ensure proper resultant leakage.

Figure 4:
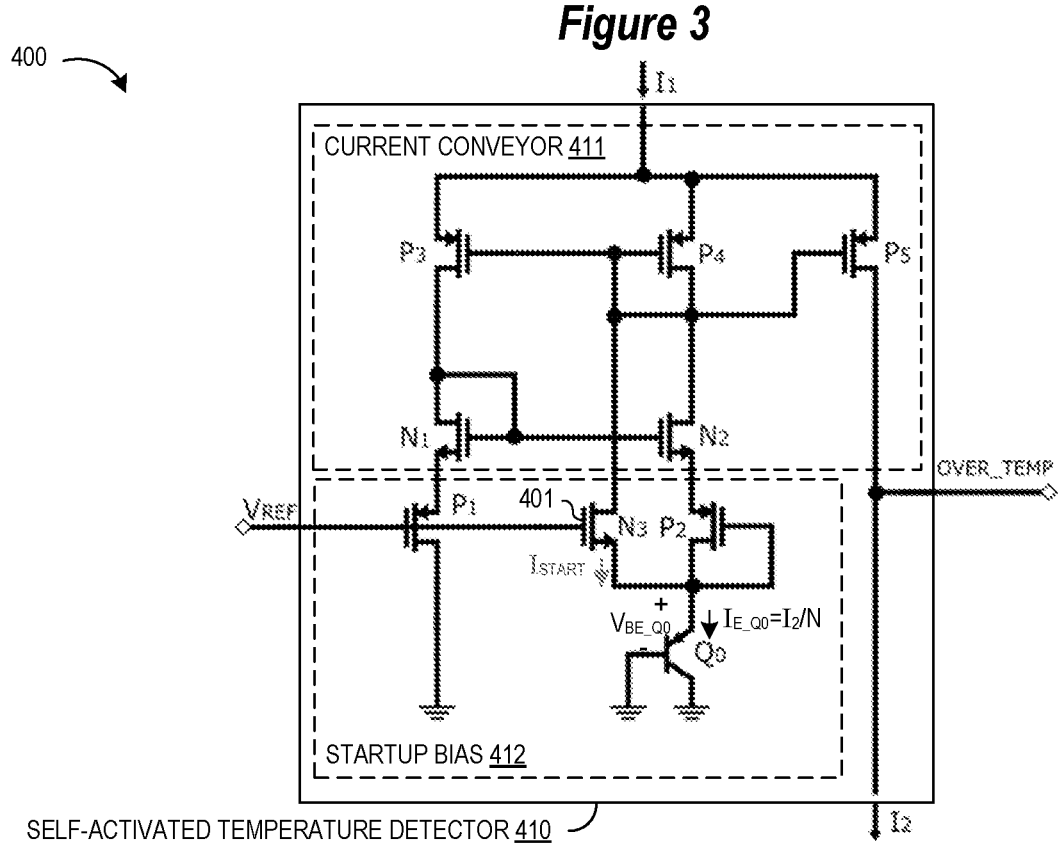
FIG. 4 shows a simplified circuit schematic diagram of a self-activated temperature detector circuit with a start-up transistor element which guarantees start-up at high temperatures in accordance with selected embodiments of the present disclosure.

To illustrate another embodiment for ensuring proper startup behavior, reference is now made to FIG. 4 which shows a simplified circuit schematic diagram 400 of a self-activated temperature detector circuit 410 with one or more start-up transistor elements N3 which guarantee start-up at high temperatures in accordance with selected embodiments of the present disclosure. As depicted, the temperature detector 410 includes a current conveyor circuit 411 and startup bias circuit 412 that are connected to compare an input reference voltage $V_{REF}$ with a base-emitter voltage $V_{BE\_Q0}$ produced by a diode-connected PNP transistor Q0 that is biased with an emitter current $I_E$ having a magnitude that is proportional to an input bias current $I_2$. In general terms, the current conveyor circuit 411 and startup bias circuit 412 are identical to the current conveyor circuit 111 and startup bias circuit 112 shown in FIG. 1. However, the startup bias circuit 412 includes an additional NMOS transistor N3 connected between the PMOS transistor P1, BJT Q0 and PMOS transistor P4. In particular, the additional NMOS transistor N3 has a gate connected to receive the reference voltage $V_{REF}$, a drain connected in common to the gates of the PMOS transistors P3-P5 and the drain of the PMOS transistor P4, and a source connected in common to the gate of the PMOS transistor P2 and the emitter of the BJT Q0. At low and mid-range junction temperatures, the additional NMOS transistor N3 is essentially turned OFF. However, when the junction temperature rises, the additional NMOS transistor N3 generates a small starting current $I_{START}$ (much lower than $I_2/N$) that is guaranteed to arise considering that $V_{EB\_Q0}(I_{START})=V_{REF}-V_{GS\_N3}(I_{START})$. Since both $V_{EB\_Q0}$ and $V_{GS\_N3}$ have negative thermal coefficients considering a fixed current, the starting current $I_{START}$ only becomes appreciable at the high-temperature range. With the starting current $I_{START}$ being mirrored by the PMOS transistor P4, this ensures start-up of the loop which then makes $V_{EB\_Q0}=V_{REF}$, thereby zeroing $V_{GS\_N3}$ and $I_{START}$.

In accordance with selected embodiments of the present disclosure, the self-activated temperature detector may be configured to detect a plurality of different temperature thresholds. For example, reference is now made to FIG. 5 which shows a simplified circuit schematic diagram 500 of a self-activated temperature detector circuit 510 to monitor multiple temperature thresholds in accordance with selected embodiments of the present disclosure. As depicted, the temperature detector 510 includes a current conveyor circuit 511 and startup bias circuit 512 that are connected to compare an input reference voltage $V_{REF}$ with a base-emitter voltage $V_{BE\_Q0}$ produced by a diode-connected PNP transistor Q0 that is biased with an emitter current $I_E$ having a magnitude that is proportional to an input bias current $I_2$. While the current conveyor circuit 511 and startup bias circuit 512 are generally similar to the current conveyor circuit 411 and startup bias circuit 412 shown in FIG. 4, the output branch of the current conveyor 511 is replicated in two additional threshold detector circuits 520, 530 which connect when the junction temperature reaches different threshold temperatures (e.g., 130 degrees and 155 degrees).

In particular, a first threshold detector 520 detects when the junction temperature exceeds a first threshold temperature of 130° C. by including a first output branch formed with the PMOS transistor P5 connected between the first input bias current $I_1$ and a second input bias current $I_2$. In particular, the source of the PMOS transistor P5 is connected to the input node A which receives the first input bias current $I_1$. In addition, the gate and drain of the PMOS transistor P5 are connected to a first over-temperature output node $OT_1$ to provide a first output state in response to the output from the shared P3, P4 gate terminals of the current conveyor 511 as shown. In this respect, the current conveyor 511, startup bias circuit 512 and first output branch PMOS transistor P5 are identical to the temperature detector 410 shown in FIG. 4.

In selected embodiments, the first threshold detector 520 may provide a temperature hysteresis behavior by including an output conditioning circuit which uses the output state at the first over-temperature output node $OT_1$ to switch circuit elements that affect parameters of Equation 2 (e.g., the Q0 emitter area, $I_2$ magnitude, N mirror ratio). For example, the output conditioning circuit may include a Schmitt-trigger amplifier 521 or other low-power logic gates (e.g., current-starved inverters) which generates a first digital over-temperature signal $T_{>130}$ from the first output state at the over-temperature output node $OT_1$. The output conditioning circuit may also include a first switched PMOS transistor P7 which is connected in parallel with the PMOS transistor P5 between the input node A and the first over-temperature output node $OT_1$. In particular, the source of the first switched shorting PMOS transistor P7 is connected to the input node A which receives the first input bias current $I_1$. In addition, the gate of the first switched shorting PMOS transistor P7 is connected to the first over-temperature output node $OT_1$. Finally, the drain of the first switched shorting PMOS transistor P7 is connected over a first switch S1 to the first over-temperature output node $OT_1$, where the first switch S1 is controlled by the first digital over-temperature signal $T_{>130}$.

In similar fashion, a second threshold detector 530 detects when the junction temperature exceeds a second threshold temperature of 155° C. by including a second output branch formed with the PMOS transistor P6 connected between the first input bias current $I_1$ and a third input bias current $I_3$. In particular, the source of the PMOS transistor P6 is connected to the input node A which receives the first input bias current $I_1$. In addition, the gate and drain of the PMOS transistor P6 are connected to a second over-temperature output node $OT_2$ to provide a second output state in response to the output from the shared P3, P4 gate terminals of the current conveyor 511 as shown. In addition, the second threshold detector 530 may provide a temperature hysteresis behavior by including an output conditioning circuit which uses the output state at the second over-temperature output node $OT_2$ to switch circuit elements that affect parameters of Equation 2. For example, the output conditioning circuit may include a Schmitt-trigger amplifier 531 or other low-power logic gates (e.g., current-starved inverters) which generates a second digital over-temperature signal $T_{>155}$ from the second output state at the over-temperature output node $OT_2$. The output conditioning circuit may also include a second switched PMOS transistor P8 which is connected in parallel with the PMOS transistor P6 between the input node A and the second over-temperature output node $OT_2$. In particular, the source of the second switched shorting PMOS transistor P8 is connected to the input node A which receives the first input bias current $I_1$. In addition, the gate of the second switched shorting PMOS transistor P8 is connected to the output from the shared P3, P4 gate terminals of the current conveyor 511 as shown. Finally, the drain of the second switched shorting PMOS transistor P8 is connected over a second switch S2 to the second over-temperature output node $OT_2$, where the second switch S2 is controlled by the second digital over-temperature signal $T_{>155}$.

Figure 5:
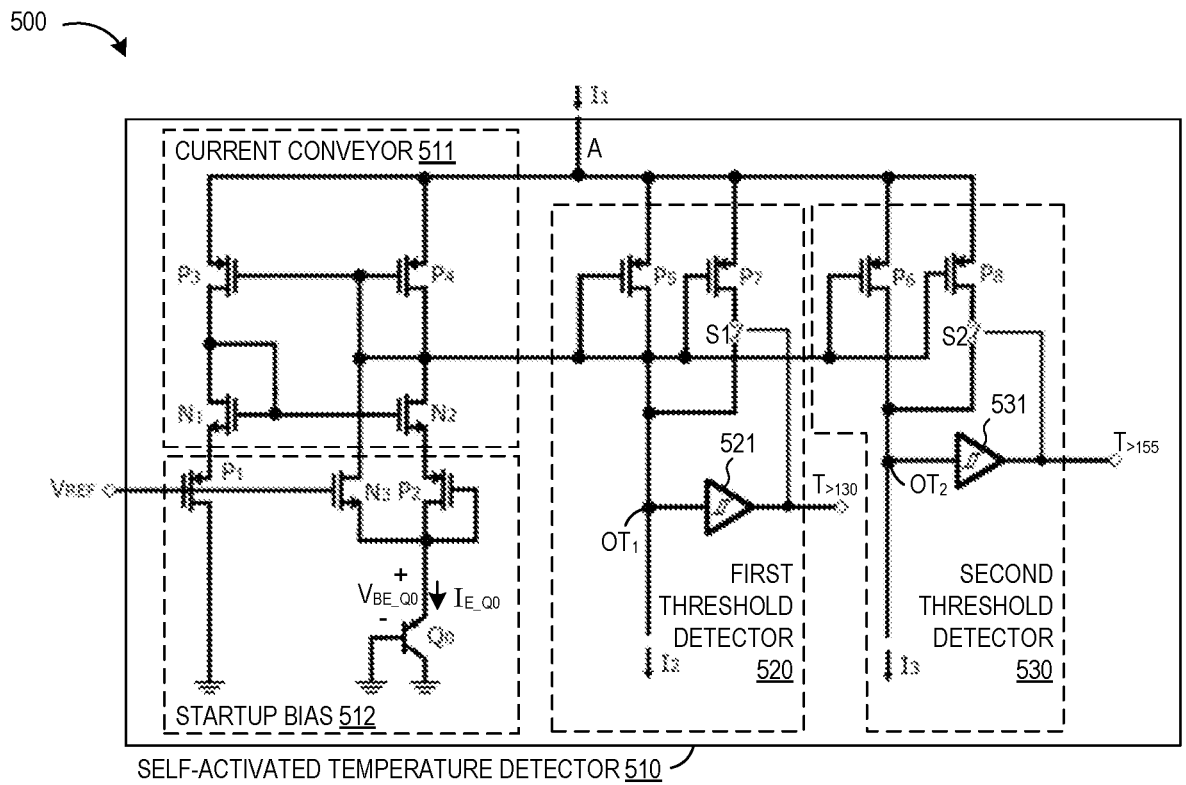
FIG. 5 shows a simplified circuit schematic diagram of a self-activated temperature detector circuit to monitor multiple temperature thresholds in accordance with selected embodiments of the present disclosure.
Figure 6:
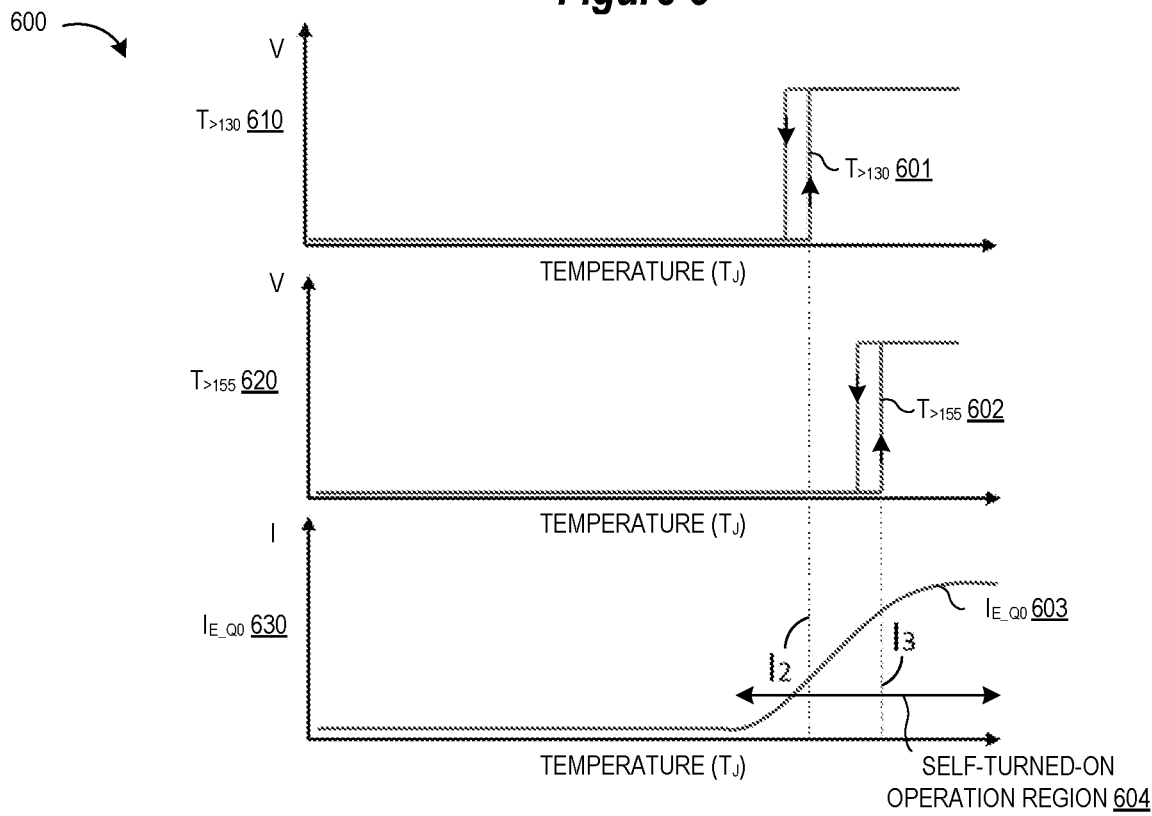
FIG. 6 shows timing diagrams for the signal waveforms of the self-activated temperature detector circuit shown in FIG. 5.

To illustrate the operation of the self-activated temperature detector circuit 510 shown in FIG. 5, reference is now made to FIG. 6 which shows timing diagrams 600 for the signal waveforms 610, 620, 630. In particular, the first voltage timing diagram 610 shows the first digital over-temperature signal $T_{>130}$ 601 as a function of the junction temperature $T_J$, where the first digital over-temperature signal $T_{>130}$ 601 has a first or LOW value when the junction temperature $T_1$ is below the first monitored threshold temperature (e.g., $T_{TSH}$=130), and has a second or HIGH value when the junction temperature $T_1$ meets or exceeds the first monitored threshold temperature $T_{TSH}$. When temperature goes from low to high, the circuit toggles at $T_{TSH}$, at which point the switch S1 is enabled to place the PMOS transistor 7 in parallel with the PMOS transistor P5, thereby changing the threshold to a lower value so when temperature is going from high to low, the circuit output goes to zero at a temperature that is lower than $T_{TSH}$ by a hysteresis shift amount. In addition, the second voltage timing diagram 620 shows the second digital over-temperature signal $T_{>155}$ 602 as a function of the junction temperature $T_J$, where the second digital over-temperature signal $T_{>155}$ 602 has a first or LOW value when the junction temperature $T_1$ is below the second monitored threshold temperature (e.g., $T_{TSH}$=155), and has a second or HIGH value when the junction temperature $T_J$ meets or exceeds the second monitored threshold temperature $T_{TSH}$. And when the temperature goes from high to low, the circuit output goes to zero at a temperature that is lower than $T_{TSH}$ by a hysteresis shift amount. At the third current timing diagram 630, the emitter current $I_{E\_Q0}$ is plotted as a function of the junction temperature $T_J$, where the emitter current $I_{E\_Q0}$ 603 has a first, negligible leakage value until the junction temperature $T_J$ reaches a self-turned-on operation region 604 where the emitter current $I_{E\_Q0}$ 603 increases to provide sufficient current to activate the temperature detector 510 to detect when the junction temperature $T_J$ meets or exceeds the first monitored threshold temperature $T_{TSH}$=130 (when $I_{E\_Q0}$=2) and the second monitored threshold temperature $T_{TSH}$=155 (when $I_{E\_Q0}$=13).

Referring back to Equation 2, it can be seen that variance in the threshold temperature $T_{TSH}$ is mainly caused by variations in the value the base-emitter voltage $V_{EBN}$. Therefore, accuracy in threshold temperature detection may be significantly increased by performing a calibration at temperature $T_N$ (e.g., a single-temperature calibration), such as by intrinsically measuring and compensating for $V_{EBN}$ spread. As disclosed herein, the calibration temperature $T_N$ may be chosen wherever convenient (e.g., cold, room, or hot temperature insertion). The calibration may be performed by adding one or more test-mode circuit elements (not shown) to the temperature detection circuit to enable direct measurement of $V_{EBN}$ that is biased with a known proportion of the input bias current $I_2$. Another calibration approach is to add test mode structures to create a closed feedback loop around the entire temperature detector circuit.

Figure 7:
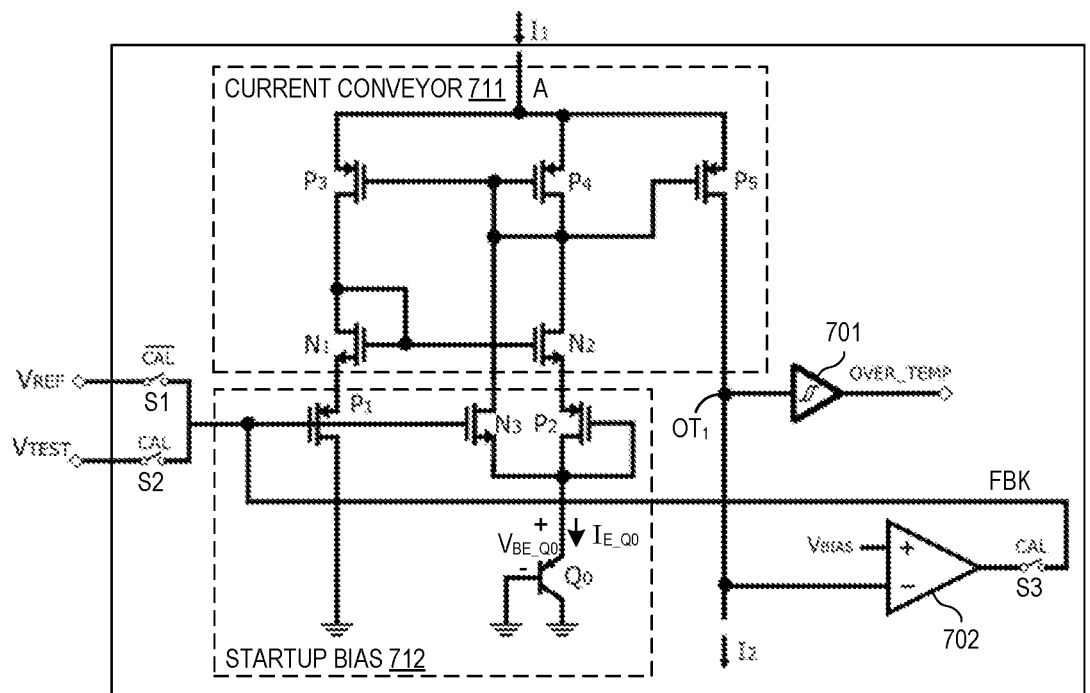
FIG. 7 shows a simplified circuit schematic diagram of a self-activated temperature detector circuit which includes a test-mode calibration feedback circuit in accordance with selected embodiments of the present disclosure.

To provide an improved understanding of selected embodiments of the present disclosure which include calibration test mode structures, reference is now made to FIG. 7 which shows a simplified circuit schematic diagram 700 of a self-activated temperature detector circuit 710 which includes current conveyor circuit 711 and startup bias circuit 712 that are connected with a test-mode calibration feedback circuit 702. While the current conveyor circuit 711 and startup bias circuit 712 are generally similar to the current conveyor circuit 411 and startup bias circuit 412 shown in FIG. 4, the output branch PMOS transistor P5 of the current conveyor 711 is connected to a Schmitt-trigger amplifier 701 or other low-power logic gates (e.g., current-starved inverters) which generates a first digital over-temperature signal OVER_TEMP from the first over-temperature output node $OT_1$ that is connected to the drain of the PMOS transistor P5. In addition, the output branch PMOS transistor P5 of the current conveyor 711 is connected to a test-mode calibration feedback circuit 702 that selectively generates a calibration feedback signal FBK from the first over-temperature output node $OT_1$. In selected embodiments, the test-mode calibration feedback circuit 702 may be embodied as an amplifier 702 which is connected to compare a bias voltage $V_{BIAS}$ (received at a non-inverting input) and the first over-temperature output node $OT_1$ (received at an inverting input) a in accordance with selected embodiments of the present disclosure. When enabled by the calibration signal (e.g., CAL=1b'1) applied to the amplifier output switch, the amplifier 702 is connected to provide the calibration feedback signal FBK to the startup bias circuit 712 at the input gate of the PMOS transistor P1. Simultaneously, the calibration signal disconnects the input reference voltage $V_{REF}$ (by opening the input switch S1) and connects the output test voltage $V_{TEST}$ (by closing the input switch S2). In this calibration test configuration, the output test voltage $V_{TEST}$ is produced which represents a measurement of $V_{EBN}(I_2/N)$ associated with the $V_{EB}$ variation and device mismatch at NMOS transistors N1-N2 and PMOS transistors P1-P5. The difference between the measured output test voltage $V_{TEST}$ and its typical value is used to calibrate the temperature detector 710 (e.g., fine tune a programmable $V_{REF}$ value) to compensate for $V_{EBN}(I2/N)$ spread and for errors caused by MOSFET device mismatch (in $1^{st}$ order). This topology also provides a low impedance output which is generally required to support production-tests.

Figure 8:
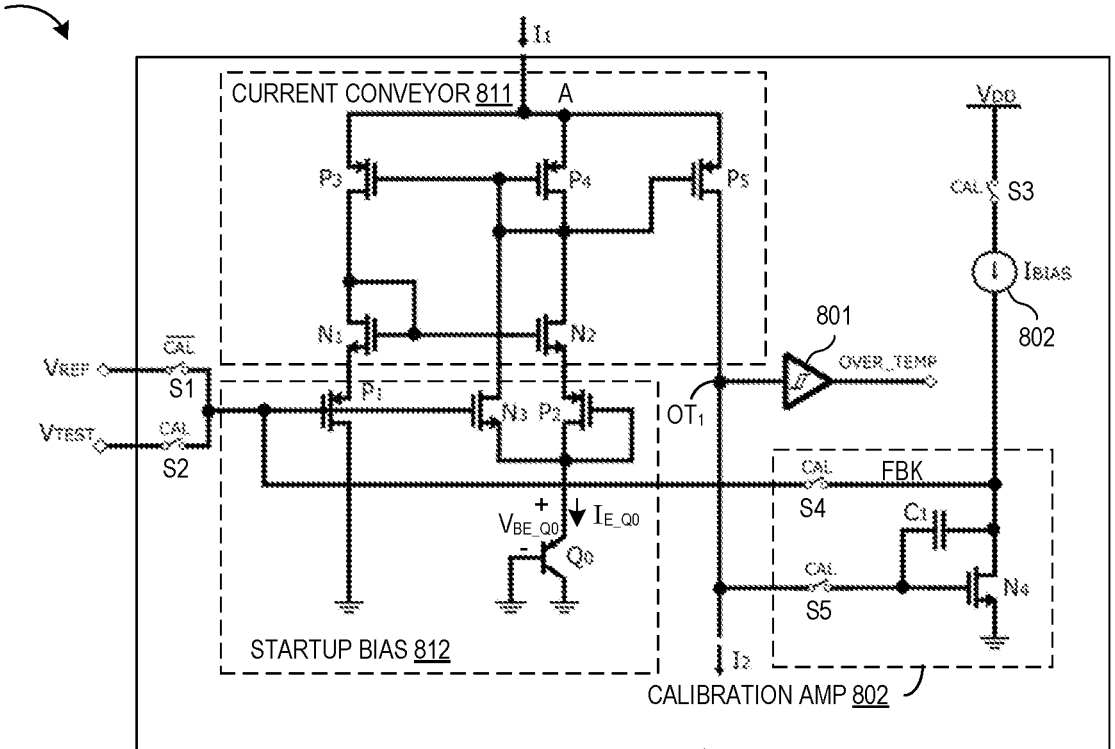
FIG. 8 shows a simplified circuit schematic diagram of a self-activated temperature detector circuit which includes a common-source transistor stage test-mode calibration circuit in accordance with selected embodiments of the present disclosure.

To provide an improved understanding of selected embodiments of the present disclosure which include calibration test mode structures, reference is now made to FIG. 8 which shows a simplified circuit schematic diagram 800 of a self-activated temperature detector circuit 810 which includes a test-mode calibration amplifier circuit 802. As shown, the current conveyor circuit 811, startup bias circuit 812, and Schmitt-trigger amplifier 801 are generally similar to the current conveyor circuit 711 and startup bias circuit 712 shown in FIG. 7. However, the output branch PMOS transistor P5 of the current conveyor 811 is connected to a test-mode calibration amplifier circuit 802 that selectively generates a calibration feedback signal FBK from the first over-temperature output node $OT_1$. In selected embodiments, the test-mode calibration amplifier circuit 802 may be embodied with a common-source NMOS transistor N4 which includes a drain terminal connected to receive a bias current source 802, a source terminal connected to ground, and a gate terminal connected over a capacitor $C_1$ to the drain terminal. When enabled by the calibration signal (e.g., CAL=1b'1) applied to the switches S1-S5, the calibration amplifier 802 is connected to provide the calibration feedback signal FBK to the startup bias circuit 812 at the input gate of the PMOS transistor P1. Simultaneously, the calibration signal disconnects the input reference voltage $V_{REF}$ (by opening the input switch S1) while connecting the output test voltage $V_{TEST}$ (by closing the input switch S2) and the bias current source 802 (by closing the $V_{DD}$ supply voltage switch S3). This calibration test configuration functionality provided by the test mode circuitry 802 operates in the same fashion as shown in FIG. 7, but in practice, the amplifier 702 of FIG. 7 could also be disabled during normal operation and have no impact on power consumption. As a result, the amplifier 702 and the feedback loop can be implemented as simple as a common source amplifier 802 that does not require a huge and intricate amplifier that consumes power in the field.

Referring back to FIG. 5, when embodiments of the self-activated temperature detector 510 are implemented without calibration, they can detect when the junction temperature crosses 137° C. and 164° C. with a 4-sigma accuracy of +/−6.9° C. and +/−7.6° C., respectively. However, when embodiments of the self-activated temperature detector 810 are implemented with a single-temperature calibration at room temperature, the temperature detection performance improves to 132° C.+/−2.0° C. and 159° C.+/−2.9° C., respectively. The circuit's maximum power consumption at room temperature is <0.4 nA, and reaches 46 nA near the 135° C. temperature threshold. In addition, its area usage is below 0.0015 mm². Compared with existing solutions, these results represent a significant improvement of the accuracy-power-area trade-off.

By now it should be appreciated that there has been provided a temperature detection device, method, and system for detecting a temperature threshold being reached by the device junction temperature. In selected embodiments, the temperature detection device includes a reference voltage generator configured to generate a reference voltage $V_{REF}$. In selected embodiments, the reference voltage generator may be embodied with a switched capacitor circuit for generate the reference voltage $V_{REF}$ by selectively sampling and holding a source reference voltage at an input capacitor. In addition, the temperature detection device includes a current conveyor connected to receive first and second bias currents and configured to produce a first over-temperature signal at an output node in response to first and second input voltages $V_{S1}$, $V_{S2}$. In selected embodiments, the current conveyor includes a first circuit branch (having a first PFET and second diode-connected NFET connected between (a) an input node for receiving the first bias current and (b) the first input voltage $V_{S1}$), a second circuit branch (having a third diode-connected PFET and fourth NFET connected between (a) the input node for receiving the first bias current and (b) the second input voltage $V_{S2}$, and an output circuit branch (having a fifth PFET connected between (a) the input node for receiving the first bias current and (b) the output node). In such embodiments of the current conveyor, the first PFET, third diode-connected PFET, and fifth PFET may have gate terminals connected in common to a drain terminal of the third diode-connected PFET to produce the first over-temperature signal at a drain terminal of the fifth PFET in response to the first and second input voltages $V_{S1}$, $V_{S2}$ only when the startup bias circuit and current conveyor are connected and activated to form the closed loop. The temperature detection device also includes a startup bias circuit configured to selectively connect the current conveyor to ground. The disclosed startup bias circuit includes a first FET device having a gate terminal connected to receive the reference voltage $V_{REF}$, a drain terminal connected to ground, and a source terminal connected to provide the first input voltage $V_{S1}$. The startup bias circuit also includes a first diode-connected bipolar junction transistor (BJT) device having base and collector terminals connected to ground and an emitter terminal connected to provide a base-emitter voltage. In addition, the startup bias circuit includes a second FET device having gate and drain terminals connected to receive the base-emitter voltage from the first diode-connected BJT device and a source terminal connected to provide the second input voltage $V_{S2}$ in response to variations in a device junction temperature detected by the first diode-connected BJT. In the disclosed configuration, the startup bias circuit and current conveyor are connected and activated to form a closed loop only when an emitter current at the first diode-connected BJT device enters a self-turned-on operation region, thereby activating the current conveyor to detect a temperature threshold being reached by the device junction temperature. In selected embodiments, the temperature detection device also includes a first pseudo-resistor connected across source and drain terminals of the first PFET to guarantee activation of the startup bias circuit and current conveyor at high temperatures, and may also include a second pseudo-resistor connected across source and drain terminals of the third diode-connected PFET. In other embodiments, the temperature detection device includes an NFET connected to provide starting current to the emitter terminal of the first diode-connected BJT device, where the NFET includes a gate terminal connected to the reference voltage $V_{REF}$, a drain terminal connected in common to the drain terminal of the third diode-connected PFET and the gate terminals of the first PFET, third diode-connected PFET, and fifth PFET, and a source terminal connected in common to the emitter terminal of the first diode-connected BJT device and the drain terminal of the second FET device. In other embodiments, the temperature detection device may include a hysteresis circuit connected between the first bias current and the output node to provide hysteresis in the first over-temperature signal. The temperature detection device may also include a test-mode calibration feedback circuit connected to the output node to selectively provide a calibration feedback signal to the first FET device of the startup bias circuit for combination with a measured output test voltage $V_{TEST}$. In selected embodiments, the test-mode calibration feedback circuit is a common-source transistor stage which is selectively connected to provide the calibration feedback signal to the first FET device.

In another form, there is provided a temperature detection device, method, and system for detecting a temperature threshold being reached by the device junction temperature. In the disclosed methodology, a reference voltage VREF is generated with a reference voltage generator. In selected embodiments, the reference voltage $V_{REF}$ is generated by selectively sampling and holding a source reference voltage at an input capacitor of a switched capacitor circuit to generate the reference voltage $V_{REF}$. The disclosed methodology also includes providing first and second bias currents to a current conveyor which is connected to a ground reference voltage over a startup circuit. As disclosed, the startup circuit includes a first FET device having a gate terminal connected to receive the reference voltage VREF, a drain terminal connected to the ground reference voltage, and a source terminal connected to provide a first input voltage VS1 to the current conveyor. The startup circuit also includes a first diode-connected bipolar junction transistor (BJT) device having base and collector terminals connected to the ground reference voltage and an emitter terminal connected to provide a base-emitter voltage. In addition, the startup circuit includes a second FET device having gate and drain terminals connected to receive the base-emitter voltage from the first diode-connected BJT device and a source terminal connected to provide a second input voltage VS2 to the current conveyor in response to variations in a device junction temperature detected by the first diode-connected BJT. In selected embodiments, first and second bias currents are provided to the current conveyor by providing the first bias current at a first circuit branch which includes a first PFET and second diode-connected NFET connected between an input node of the first branch and the first input voltage $V_{S1}$, and by providing the first bias current at a second circuit branch which includes a third diode-connected PFET and fourth NFET connected between an input node of the second branch and the second input voltage $V_{S2}$. In selected embodiments, the first circuit branch includes a first pseudo-resistor connected across source and drain terminals of the first PFET to guarantee activation of the startup bias circuit and current conveyor at high temperatures, and the second circuit branch may also include a second pseudo-resistor connected across source and drain terminals of the third diode-connected PFET. In such embodiments, the first PFET and third diode-connected PFET have gate terminals connected in common to a drain terminal of the third diode-connected PFET, and the second diode-connected NFET and fourth NFET have gate terminals connected in common to a drain terminal of the second diode-connected NFET. In addition, the first over-temperature signal may be produced at the output node of the first threshold detector by providing the first bias current at a first output circuit branch which includes a fifth PFET connected between an input node of the output branch and the output node which is connected to the second bias current. In such embodiments, the first PFET, third diode-connected PFET, and fifth PFET have gate terminals connected in common to a drain terminal of the third diode-connected PFET to produce the first over-temperature signal at the output node connected to a drain terminal of the fifth PFET in response to the first and second input voltages $V_{S1}$, $V_{S2}$ only when the startup bias circuit and current conveyor are connected and activated to form the closed loop. In addition, the disclosed methodology includes producing a first over-temperature signal at an output node of a first threshold detector connected to the current conveyor. This occurs when the startup bias circuit forms a closed loop to selectively connect the current conveyor to the ground reference voltage only when an emitter current at the first diode-connected BJT device enters a self-turned-on operation region so that the emitter current has a first, negligible leakage value until the device junction temperature reaches the self-turned-on operation region which activates the first threshold detector to detect a temperature threshold being reached by the device junction temperature. In selected embodiments, the disclosed methodology also includes providing a starting current to the emitter terminal of the first diode-connected BJT device with an NFET which includes a gate terminal connected to the reference voltage $V_{REF}$; a drain terminal connected in common to the drain terminal of the third diode-connected PFET and the gate terminals of the first PFET, third diode-connected PFET, and fifth PFET; and a source terminal connected in common to the emitter terminal of the first diode-connected BJT device and the drain terminal of the second FET device. In addition, the disclosed methodology may also include connecting a hysteresis circuit between the first bias current and the output node to provide hysteresis in the first over-temperature signal. The disclosed methodology may also include producing a second over-temperature signal at an output node of a second threshold detector connected to the current conveyor when the startup bias circuit forms a closed loop to selectively connect the current conveyor to the ground reference voltage only when an emitter current at the first diode-connected BJT device enters a self-turned-on operation region so that the emitter current has a first, negligible leakage value until the device junction temperature reaches the self-turned-on operation region which activates the second threshold detector to detect a second, higher temperature threshold being reached by the device junction temperature.

In yet another form, there is provided a low power device, method, and system for detecting a temperature threshold being reached by the device junction temperature. The disclosed device includes a current conveyor circuit connected to receive first and second bias currents and comprising a current mirror and a threshold detector connected to a first over-temperature output node. In addition, the disclosed device includes a startup bias circuit connected between the current conveyor circuit and a ground reference voltage to receive a reference voltage VREF. As disclosed, the startup bias circuit includes a first PFET device having a gate terminal connected to the reference voltage VREF, a drain terminal connected to the ground reference voltage, and a source terminal connected to provide a first input voltage VS1 to the current conveyor circuit. The disclosed startup bias circuit also includes a first diode-connected bipolar junction transistor (BJT) device having base and collector terminals connected to the ground reference voltage and an emitter terminal connected to provide a base-emitter voltage. In addition, the disclosed startup bias circuit includes a second PFET device having gate and drain terminals connected to receive the base-emitter voltage from the first diode-connected BJT device and a source terminal connected to provide a second input voltage VS2 to the current conveyor circuit in response to variations in a device junction temperature detected by the first diode-connected BJT device. As disclosed, the startup bias circuit is configured to generate a negligible leakage current at the emitter terminal of the first diode-connected BJT device at low device junction temperatures until the device junction temperature reaches a self-turned-on operation region which activates the startup bias circuit to form a closed loop between the current conveyor circuit and ground reference voltage so that the current conveyor circuit is activated to produce a first over-temperature signal at the first over-temperature output node when the threshold detector detects that the device junction temperature reaches a temperature threshold. In selected embodiments, the device may also include a test-mode calibration feedback circuit that is connected to selectively generate a calibration feedback signal FBK from the first over-temperature output node in response to an output test voltage being provided to the gate terminal of the first PFET device to represent a measurement of $V_{EBN}$.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:
1. A temperature detection device, comprising:
a reference voltage generator configured to generate a reference voltage $V_{REF}$;
a current conveyor connected to receive first and second bias currents and configured to produce a first over-temperature signal at an output node in response to first and second input voltages $V_{S1}$, $V_{S2}$; and a startup bias circuit configured to selectively connect the current conveyor to ground, comprising:

a first FET device having a gate terminal connected to receive the reference voltage $V_{REF}$, a drain terminal connected to ground, and a source terminal connected to provide the first input voltage $V_{S1}$, a first diode-connected bipolar junction transistor (BJT) device having base and collector terminals connected to ground and an emitter terminal connected to provide a base-emitter voltage, and a second FET device having gate and drain terminals connected to receive the base-emitter voltage from the first diode-connected BJT device and a source terminal connected to provide the second input voltage $V_{S2}$ in response to variations in a device junction temperature detected by the first diode-connected BJT, where the startup bias circuit and current conveyor are connected and activated to form a closed loop only when an emitter current at the first diode-connected BJT device enters a self-turned-on operation region, thereby activating the current conveyor to detect a temperature threshold being reached by the device junction temperature.

2. The temperature detection device of claim 1, where the reference voltage generator comprises a switched capacitor circuit for generate the reference voltage $V_{REF}$ by selectively sampling and holding a source reference voltage at an input capacitor.

3. The temperature detection device of claim 1, where the current conveyor comprises:

a first circuit branch comprising a first PFET and second diode-connected NFET connected between (a) an input node for receiving the first bias current and (b) the first input voltage $V_{S1}$;

a second circuit branch comprising a third diode-connected PFET and fourth NFET connected between (a) the input node for receiving the first bias current and (b) the second input voltage $V_{S2}$; and an output circuit branch comprising a fifth PFET connected between (a) the input node for receiving the first bias current and (b) the output node;

where the first PFET, third diode-connected PFET, and fifth PFET have gate terminals connected in common to a drain terminal of the third diode-connected PFET to produce the first over-temperature signal at a drain terminal of the fifth PFET in response to the first and second input voltages $V_{S1}$, $V_{S2}$ only when the startup bias circuit and current conveyor are connected and activated to form the closed loop.

4. The temperature detection device of claim 3, further comprising a first pseudo-resistor connected across source and drain terminals of the first PFET to guarantee activation of the startup bias circuit and current conveyor at high temperatures.

5. The temperature detection device of claim 4, further comprising a second pseudo-resistor connected across source and drain terminals of the third diode-connected PFET.

6. The temperature detection device of claim 3, further comprising an NFET connected to provide starting current to the emitter terminal of the first diode-connected BJT device, where the NFET comprises:

a gate terminal connected to the reference voltage $V_{REF}$, a drain terminal connected in common to the drain terminal of the third diode-connected PFET and the gate terminals of the first PFET, third diode-connected PFET, and fifth PFET, and a source terminal connected in common to the emitter terminal of the first diode-connected BJT device and the drain terminal of the second FET device.

7. The temperature detection device of claim 1, further comprising a hysteresis circuit connected between the first bias current and the output node to provide hysteresis in the first over-temperature signal.

8. The temperature detection device of claim 1, further comprising a test-mode calibration feedback circuit connected to the output node to selectively provide a calibration feedback signal to the first FET device of the startup bias circuit for combination with a measured output test voltage $V_{TEST}$.

9. The temperature detection device of claim 1, where the test-mode calibration feedback circuit comprises a common-source transistor stage which is selectively connected to provide the calibration feedback signal to the first FET device.

10. A temperature detection method, comprising:

generating a reference voltage $V_{REF}$ with a reference voltage generator;

providing first and second bias currents to a current conveyor which is connected to a ground reference voltage over a startup circuit comprising:

a first FET device having a gate terminal connected to receive the reference voltage $V_{REF}$, a drain terminal connected to the ground reference voltage, and a source terminal connected to provide a first input voltage $V_{S1}$ to the current conveyor, a first diode-connected bipolar junction transistor (BJT) device having base and collector terminals connected to the ground reference voltage and an emitter terminal connected to provide a base-emitter voltage, and a second FET device having gate and drain terminals connected to receive the base-emitter voltage from the first diode-connected BJT device and a source terminal connected to provide a second input voltage $V_{S2}$ to the current conveyor in response to variations in a device junction temperature detected by the first diode-connected BJT; and producing a first over-temperature signal at an output node of a first threshold detector connected to the current conveyor when the startup bias circuit forms a closed loop to selectively connect the current conveyor to the ground reference voltage only when an emitter current at the first diode-connected BJT device enters a self-turned-on operation region so that the emitter current has a first leakage value until the device junction temperature reaches the self-turned-on operation region which activates the first threshold detector to detect a temperature threshold being reached by the device junction temperature.

11. The temperature detection method of claim 10, where generating the reference voltage $V_{REF}$ comprises selectively sampling and holding a source reference voltage at an input capacitor of a switched capacitor circuit to generate the reference voltage $V_{REF}$.

12. The temperature detection method of claim 10, where providing first and second bias currents to the current conveyor comprises:
   providing the first bias current at a first circuit branch comprising a first PFET and second diode-connected NFET connected between an input node of the first branch and the first input voltage $V_{S1}$; and
   providing the first bias current at a second circuit branch comprising a third diode-connected PFET and fourth NFET connected between an input node of the second branch and the second input voltage $V_{S2}$,
   where the first PFET and third diode-connected PFET have gate terminals connected in common to a drain terminal of the third diode-connected PFET, and where second diode-connected NFET and fourth NFET have gate terminals connected in common to a drain terminal of the second diode-connected NFET.

13. The temperature detection method of claim 12, where producing the first over-temperature signal at the output node of the first threshold detector comprises providing the first bias current at a first output circuit branch comprising a fifth PFET connected between an input node of the output branch and the output node which is connected to the second bias current,
   where the first PFET, third diode-connected PFET, and fifth PFET have gate terminals connected in common to a drain terminal of the third diode-connected PFET to produce the first over-temperature signal at the output node connected to a drain terminal of the fifth PFET in response to the first and second input voltages $V_{S1}$, $V_{S2}$ only when the startup bias circuit and current conveyor are connected and activated to form the closed loop.

14. The temperature detection method of claim 12, where the first bias current is provided to the first circuit branch which comprises a first pseudo-resistor connected across source and drain terminals of the first PFET to guarantee activation of the startup bias circuit and current conveyor at high temperatures.

15. The temperature detection method of claim 12, where the first bias current is provided at the second circuit branch which comprises a second pseudo-resistor connected across source and drain terminals of the third diode-connected PFET.

16. The temperature detection method of claim 10, further comprising providing a starting current to the emitter terminal of the first diode-connected BJT device with an NFET comprising a gate terminal connected to the reference voltage $V_{REF}$; a drain terminal connected in common to the drain terminal of the third diode-connected PFET and the gate terminals of the first PFET, third diode-connected PFET, and fifth PFET; and a source terminal connected in common to the emitter terminal of the first diode-connected BJT device and the drain terminal of the second FET device.

17. The temperature detection method of claim 10, further comprising connecting a hysteresis circuit between the first bias current and the output node to provide hysteresis in the first over-temperature signal.

18. The temperature detection method of claim 10, further comprising producing a second over-temperature signal at an output node of a second threshold detector connected to the current conveyor when the startup bias circuit forms a closed loop to selectively connect the current conveyor to the ground reference voltage only when an emitter current at the first diode-connected BJT device enters a self-turned-on operation region so that the emitter current has a first leakage value until the device junction temperature reaches the self-turned-on operation region which activates the second threshold detector to detect a second, higher temperature threshold being reached by the device junction temperature.

19. A device, comprising:
   a current conveyor circuit connected to receive first and second bias currents and comprising a current mirror and a threshold detector connected to a first over-temperature output node; and
   a startup bias circuit connected between the current conveyor circuit and a ground reference voltage to receive a reference voltage $V_{REF}$, the startup bias circuit comprising:
      a first PFET device having a gate terminal connected to the reference voltage $V_{REF}$, a drain terminal connected to the ground reference voltage, and a source terminal connected to provide a first input voltage $V_{S1}$ to the current conveyor circuit,
      a first diode-connected bipolar junction transistor (BJT) device having base and collector terminals connected to the ground reference voltage and an emitter terminal connected to provide a base-emitter voltage, and
      a second PFET device having gate and drain terminals connected to receive the base-emitter voltage from the first diode-connected BJT device and a source terminal connected to provide a second input voltage $V_{S2}$ to the current conveyor circuit in response to variations in a device junction temperature detected by the first diode-connected BJT device,
   where the startup bias circuit is configured to generate a leakage current at the emitter terminal of the first diode-connected BJT device at low device junction temperatures until the device junction temperature reaches a self-turned-on operation region which activates the startup bias circuit to form a closed loop between the current conveyor circuit and ground reference voltage so that the current conveyor circuit is activated to produce a first over-temperature signal at the first over-temperature output node when the threshold detector detects that the device junction temperature reaches a temperature threshold.

20. The device of claim 19, further comprising a test-mode calibration feedback circuit that is connected to selectively generate a calibration feedback signal FBK from the first over-temperature output node in response to an output test voltage being provided to the gate terminal of the first PFET device to represent a measurement of $V_{EBN}$.

* * * * *